(12) United States Patent
Miller et al.

(10) Patent No.: US 6,868,512 B1
(45) Date of Patent: Mar. 15, 2005

(54) FAULT DETECTION SYSTEM WITH REAL-TIME DATABASE

(75) Inventors: Michael L. Miller, Cedar Park, TX (US); Elfido Coss, Jr., Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 434 days.

(21) Appl. No.: 10/229,226

(22) Filed: Aug. 27, 2002

(51) Int. Cl.[7] .......................... H02H 3/05; G01R 31/28
(52) U.S. Cl. .......................... 714/724; 714/15; 707/202
(58) Field of Search .......................... 714/724, 746, 714/752, 774, 799, 738, 739, 741, 15, 16, 30, 31, 32, 33, 37, 46, 48, 52, 57; 706/45, 46, 50; 455/423; 707/1, 2, 9, 10, 202, 204; 709/100, 200, 203, 223, 224

(56) References Cited

U.S. PATENT DOCUMENTS 5,280,611 A * 1/1994 Mohan et al. .................. 707/8
6,275,824 B1 * 8/2001 O'Flaherty et al. ............ 707/9
6,453,163 B1 * 9/2002 Karapetkov et al. ......... 455/433
6,668,262 B1 * 12/2003 Cook .......................... 707/204

* cited by examiner

Primary Examiner—Christine T. Tu
(74) Attorney, Agent, or Firm—Williams, Morgan & Amerson

(57) ABSTRACT

A method includes receiving incoming fault detection and correction (FDC) data. The incoming FDC data is stored in a real-time database. A first subscriber list designating a first subscriber for at least a portion of the incoming FDC data is provided. The portion of the incoming FDC data designated in the first subscriber list is sent to the first subscriber. A system includes at least one data collection source, a real-time database, and a database management unit. The data collection source is configured to generate incoming fault detection and correction (FDC) data. The database management unit is configured to store the incoming FDC data in the real-time database, provide a first subscriber list designating a first subscriber for at least a portion of the incoming FDC data, and send the portion of the incoming FDC data designated in the first subscriber list to the first subscriber.

27 Claims, 3 Drawing Sheets

FAULT DETECTION SYSTEM WITH REAL-TIME DATABASE

BACKGROUND OF THE INVENTION

1. Field of the Invention

This invention relates generally to the field of semiconductor device manufacturing and, more particularly, to a fault detection system with a real-time database.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

Statistical process control (SPC) techniques are commonly used to monitor the operation of manufacturing processes, systems, or individual manufacturing tools. Commonly, various measurements related to the process being monitored are compiled and analyzed. Fault detection data may include data related to the manufactured devices as well as data related to the operating parameters of the tools. For example, physical measurements, such as line width, or electrical measurements, such as contact resistance, may be used to detect faults in fabricated devices. Tool parameters, such as chamber pressure, temperature, voltage, reactive gas makeup, etc., may be evaluated during the processing of devices in the tool to detect fault conditions with the tools themselves.

Due to the large number tools and processes being performed in a semiconductor manufacturing facility, the volume of fault detection data being collected is extremely high. Typical fault detection systems route the data collected to various fault detection applications. The fault detection applications process the data to identify faults and then store the data and FDC results in databases. One limitation in such systems is that all data paths must be configured such that a particular data collector (e.g., sensor, metrology tool, etc.) knows how to route its data such that the interested consumers receive it. Subsequently, each consumer must be configured to route its results and the raw data for archival purposes. Each consumer must also be configured to send its results to other consumers (e.g., tool operator, engineer, scheduling system, etc.) such that appropriate corrective actions may be taken. As new data collectors and consumers are added to the system, the number of communication paths that must be configured becomes increasingly large. The large number of individually configured data paths gives rise to configuration control problems. The distributed nature of the different databases used to store the raw data and processed results also causes data coordination and accessibility problems.

The present invention is directed to overcoming, or at least reducing the effects of, one or more of the problems set forth above.

SUMMARY OF THE INVENTION

One aspect of the present invention is seen in a method that includes receiving incoming fault detection and correction (FDC) data. The incoming FDC data is stored in a real-time database. A first subscriber list designating a first subscriber for at least a portion of the incoming FDC data is provided. The portion of the incoming FDC data designated in the first subscriber list is sent to the first subscriber.

Another aspect of the present invention is seen in a system including at least one data collection source, a real-time database, and a database management unit. The data collection source is configured to generate incoming fault detection and correction (FDC) data. The database management unit is configured to store the incoming FDC data in the real-time database, provide a first subscriber list designating a first subscriber for at least a portion of the incoming FDC data, and send the portion of the incoming FDC data designated in the first subscriber list to the first subscriber.

BRIEF DESCRIPTION OF THE DRAWINGS

The invention may be understood by reference to the following description taken in conjunction with the accompanying drawings, in which like reference numerals identify like elements, and in which.

Figure 1:
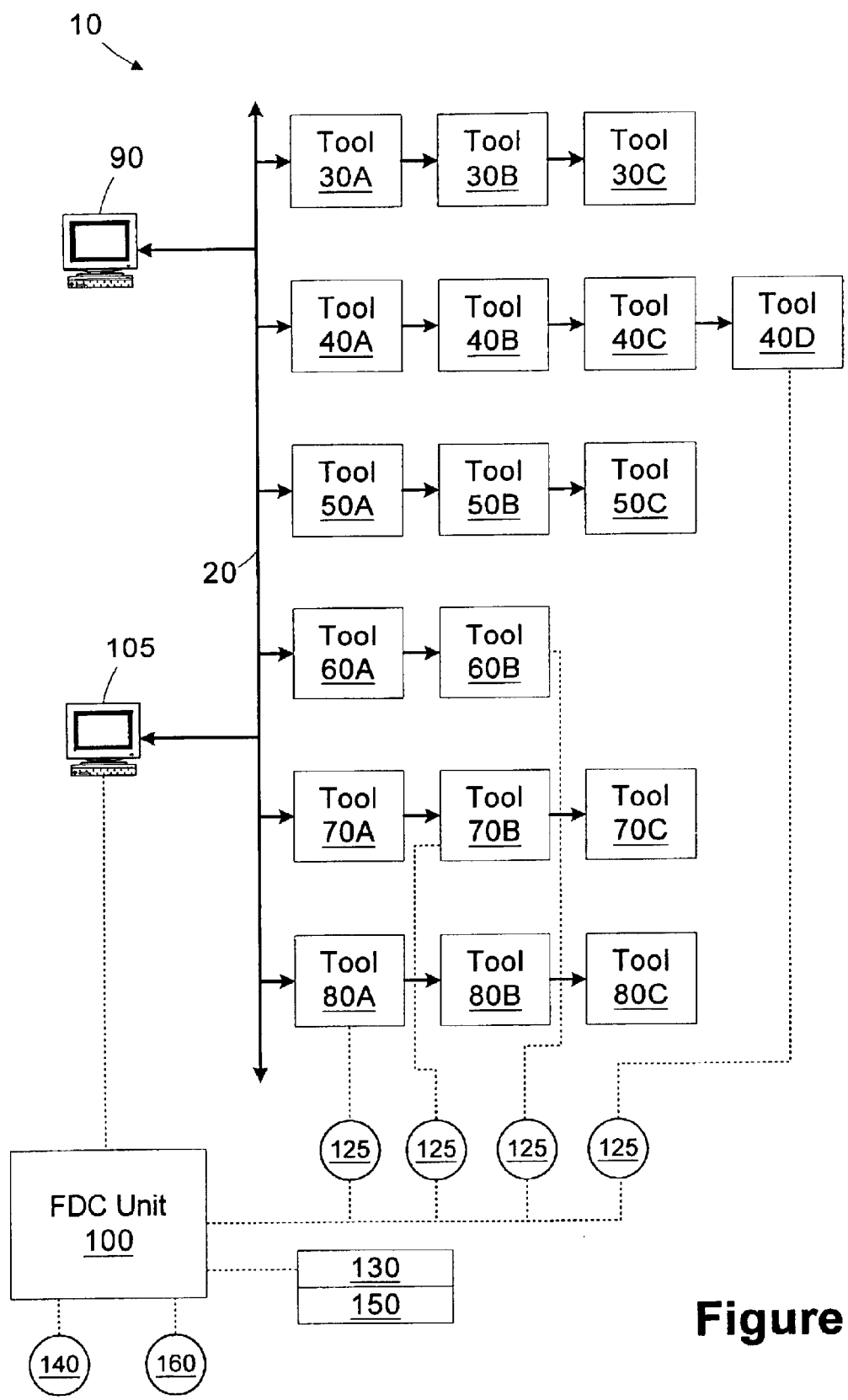
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to, achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items including, but not limited to microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment, include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any order or grouping. Additionally, the connections between the tools in a particular grouping are meant to represent only connections to the network 20, rather than interconnections between the tools.

A manufacturing execution system (MES) server 90 directs the high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A fault detection and classification (FDC) unit 100 operating on a computer 105 is provided for collecting and routing FDC data associated with the various entities and articles of manufacture in the process flow.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The distribution of the processing and data storage functions amongst the different computers or workstations in FIG. 1 is generally conducted to provide independence and central information storage. Of course, different numbers of computers and different arrangements may be used.

Figure 2:
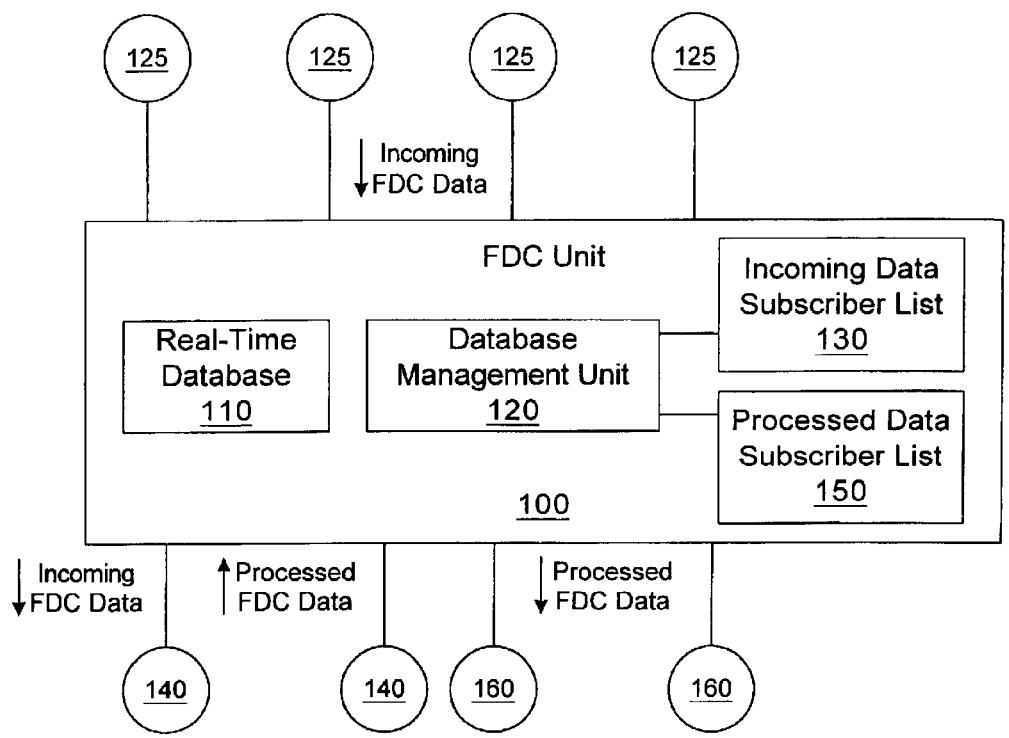
FIG. 2 is a simplified block diagram of a portion of the manufacturing system of FIG. 1.

Referring now to FIG. 2, a simplified block diagram of the FDC unit 100 is provided. The FDC unit 100 includes a real-time database 110 controlled by a database management unit 120 (e.g., software application). The FDC unit 100 receives incoming FDC data from various data collection sources 125. The incoming FDC data represents unprocessed data from sensors or metrology tools relating to product or process conditions in the manufacturing system 10. Exemplary product data includes physical measurement data (e.g., line width, process layer thickness, trench depth, planarity, uniformity, photoresist pattern data, etc.), electrical measurement data (e.g., resistivity, contact resistance, dielectric constant, drive current, leakage current, etc.), or tool state data (e.g., tool state data for an etch tool may include gas flow, chamber pressure, chamber temperature, voltage, reflected power, backside helium pressure, RF tuning parameters, etc.). The particular makeup for the incoming FDC data is application dependent and the application of the present invention is not limited to any particular type of incoming FDC data. The specification of data sources for generating incoming FDC data is well known to those of ordinary skill in the art, and for clarity and to avoid obscuring the present invention, it is not described in greater detail herein.

The database management unit 120 stores the incoming FDC data from the data collection sources 125 in the real-time database 110. The database management unit 120 also maintains an incoming data subscriber list 130 for the incoming FDC data. In the illustrated embodiment, entries in the incoming data subscriber list 130 include subscriber identification data (e.g., logical name, physical address, etc.) and trigger information. One or more triggering conditions may be defined, which when met, cause the database management unit 120 to route the incoming FDC data to a designated subscriber 140. These triggering conditions may filter the data based on predefined logic conditions. For example, the trigger might indicate that if data from a certain process tool (e.g., by tool name) or type of process tool (e.g., all etch tools) is received, it should be routed to the designated subscriber 140. The triggering condition might also operate on the value of the data itself. For example, if a particular physical measurement or tool state value is outside a predetermined range, the incoming FDC data may be routed to the designated subscriber 140.

The database management unit 120 may route the data in various ways. In one embodiment, the database management unit 120 evaluates the trigger conditions in the incoming data subscriber list 130 as the incoming FDC data is received. The database management unit 120 may send the incoming FDC data to the designated subscriber 140 at the same time it is being committed to the real-time database 110 (i.e., in parallel) or after it has been stored (i.e., serially). The database management unit 120 may send the incoming FDC directly to the subscriber 140 or, alternatively, the database management unit 120 may send a notification to the subscriber that it has received data of interest to the subscriber 140. The subscriber 140 could subsequently initiate a read request to the real-time database 110 to retrieve the specified data.

A particular subscriber 140 processes the incoming data to identify fault conditions. Various FDC techniques are well known to those of ordinary skill in the art, and for clarity and to avoid obscuring the present invention, they are not described in greater detail herein. Exemplary FDC techniques include control chart/control limit analysis, multivariate analysis, etc. An exemplary multivariate software tool for determining tool health is ModelWare™ offered by Triant, Inc. of Nanaimo, British Columbia, Canada Vancouver, Canada. An exemplary system for monitoring tool health is described in U.S. patent application Ser. No. 09/863,822, entitled "METHOD AND APPARATUS FOR MONITORING TOOL HEALTH," filed in the names of Elfido Coss Jr., Richard J. Markle, and Patrick M. Cowan, that is assigned to the assignee of the present application and incorporated herein by reference in its entirety.

The subscribers 140 sends the processed FDC data they generate to the real-time database 110. The database management unit 120 maintains a processed data subscriber list 150 for the processed FDC data. Similar to the subscriptions defined for the incoming FDC data, the processed data subscriber list 150 allows subscribers 160 to subscribe to the FDC results data. Again, the database management unit 120 may store the processed FDC data in parallel or series with respect to the routing to the identified subscribers 150. In the illustrated embodiment, entries in the processed data subscriber list 150 include subscriber identification data (e.g., logical name, physical address, etc.) and trigger information. The identification data and triggering conditions may be similar to those offered for the incoming FDC data.

The subscribers 160 for the processed FDC data may perform various troubleshooting or corrective actions based on the results of the FDC analysis. For example, one of the subscribers 160 for the processed FDC may be configured to generate email messages to notify individuals of the fault conditions. Another subscriber 160 may notify the MES server 90 (i.e., or the MES server 90 may be a subscriber) to log a tool 30–80 out of service or initiate a maintenance activity to correct a fault condition with the tool 30–80. Similarly, the MES server 90 may be notified of defective workpieces (i.e., wafers or lots) that need to be reworked or scrapped. The application of the present invention is not limited to any particular data collection sources 125 or subscribers 140, 160 for the incoming FDC data or the processed FDC data.

The real-time database 110 provides a centralized repository for both the incoming FDC data and the processed FDC data. Data collection sources 125 (e.g., sensors, metrology tools) for the incoming FDC data need only be configured to send the data they collect to the real-time database 110. Likewise, the subscribers 140 that process the FDC data need only be configured to send their results to the real-time database 110. The subscriber lists 140, 160 define the particular routings for the incoming and processed FDC data. This arrangement simplifies configuration control because only the subscriber lists 140, 160 require updating when additional collection sources or subscribers 140, 160 are added.

Various software components may be used to implement the real-time database 110 and the database management unit 120. An exemplary system for performing the functions described herein include an Oracle® Database (Oracle Corporation headquartered in Redwood Shores, Calif.) used in conjunction with a real-time StarView database management system offered by StarView of San Jose, Calif. In general a real-time database system is capable of handling large datastreams in real-time (e.g., tens to hundreds of thousands of operations per second).

Figure 3:
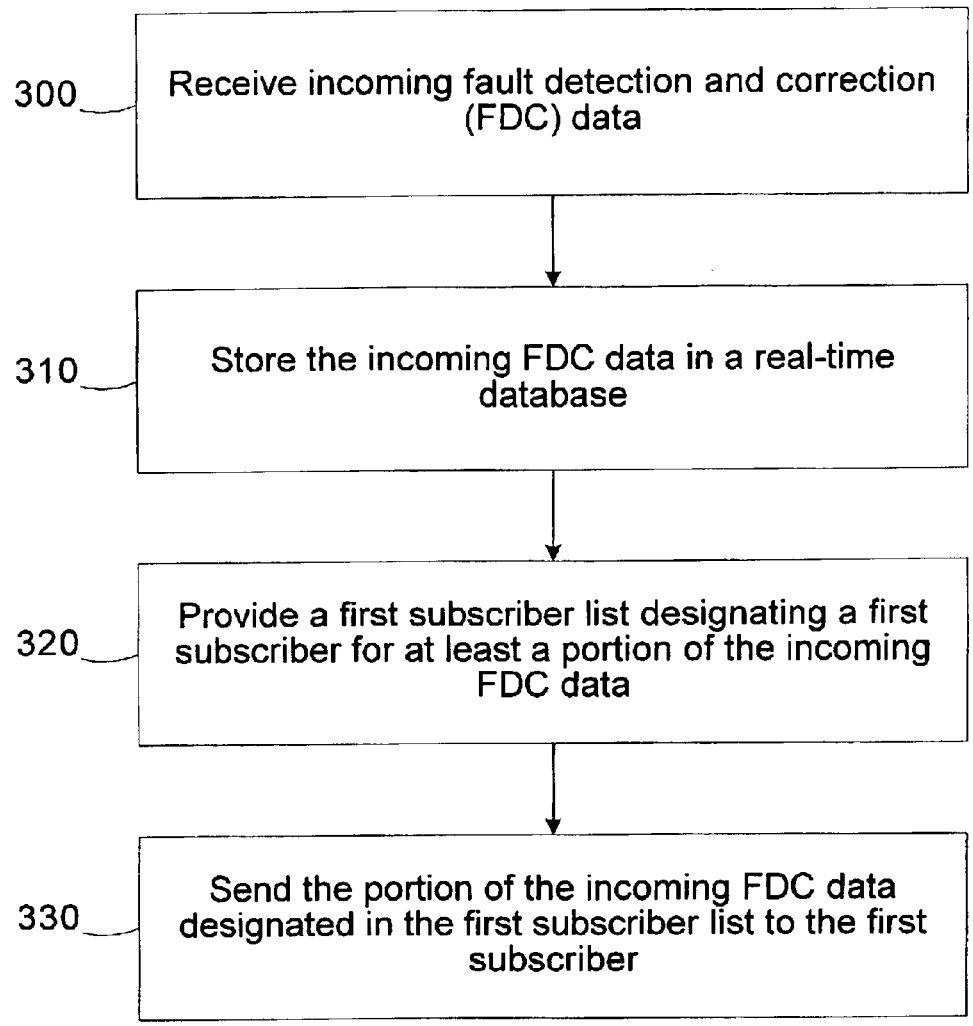
FIG. 3 is a simplified flow diagram of a method for processing FDC data in accordance with another illustrative embodiment of the present invention.

FIG. 3 is a simplified flow diagram of a method for processing FDC data in accordance with another illustrative embodiment of the present invention. In block 300, incoming fault detection and correction (FDC) data is received. In block 310, the incoming FDC data is stored in a real-time database. In block 320, a first subscriber list designating a first subscriber for at least a portion of the incoming FDC data is provided. In block 330, the portion of the incoming FDC data designated in the first subscriber list is sent to the first subscriber.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    receiving incoming fault detection and correction (FDC) data;
    storing the incoming FDC data in a real-time database;
    providing a first subscriber list designating a first subscriber for at least a portion of the incoming FDC data; and
    sending the portion of the incoming FDC data designated in the first subscriber list to the first subscriber.

2. The method of claim 1, wherein storing the incoming FDC data further comprises storing the incoming FDC data in parallel with sending the portion of the incoming FDC data designated in the first subscriber list to the first subscriber.

3. The method of claim 1, wherein sending the portion of the incoming FDC data designated in the first subscriber list to the first subscriber further comprising sending a notification message to the first subscriber that the portion of the incoming FDC data designated in the first subscriber list is stored in the real-time database.

4. The method of claim 1, further comprising:
    defining a trigger condition for the first subscriber in the first subscriber list; and
    sending the portion of the incoming FDC data designated in the first subscriber list to the first subscriber responsive to the incoming FDC data satisfying the trigger condition.

5. The method of claim 4, wherein defining the trigger condition further comprises defining a logical trigger condition.

6. The method of claim 4, wherein defining the trigger condition further comprises defining the trigger condition based on an identity of a data collection source for the incoming FDC data.

7. The method of claim 1, further comprising:
    analyzing the incoming FDC data in the first subscriber to generate FDC results; and
    sending the FDC results to the real-time database.

8. The method of claim 7, further comprising:
    providing a second subscriber list designating a second subscriber for at least a portion of the FDC results; and
    sending the portion of the FDC results designated in the second subscriber list to the second subscriber.

9. The method of claim 7, wherein storing the FDC results further comprises storing the FDC results in parallel with sending the portion of the FDC results designated in the second subscriber list to the second subscriber.

10. The method of claim 7, wherein sending the portion of the FDC results designated in the second subscriber list to the second subscriber further comprises sending a notification message to the second subscriber that the portion of the FDC results designated in the second subscriber list is stored in the real-time database.

11. The method of claim 8, further comprising:
    defining a trigger condition for the second subscriber in the second subscriber list; and
    sending the portion of the FDC results designated in the second subscriber list to the second subscriber responsive to the incoming FDC data satisfying the trigger condition.

12. The method of claim 11, wherein defining the trigger condition further comprises defining a logical trigger condition.

13. The method of claim 8, further comprising implementing an automatic corrective action in the second subscriber based on the FDC results.

14. A system, comprising:
    at least one data collection source configured to generate incoming fault detection and correction (FDC) data;
    a real-time database; and
    a database management unit configured to store the incoming FDC data in the real-time database, provide a first subscriber list designating a first subscriber for at least a portion of the incoming FDC data, and send the portion of the incoming FDC data designated in the first subscriber list to the first subscriber.

15. The system of claim 14, wherein the database management unit is further configured to store the incoming FDC data in parallel with sending the portion of the incoming FDC data designated in the first subscriber list to the first subscriber.

16. The system of claim 14, wherein the database management unit is further configured to send a notification message to the first subscriber that the portion of the incoming FDC data designated in the first subscriber list is stored in the real-time database.

17. The system of claim 14, wherein the database management unit is further configured to define a trigger condition for the first subscriber in the first subscriber list and send the portion of the incoming FDC data designated in the first subscriber list to the first subscriber responsive to the incoming FDC data satisfying the trigger condition.

18. The system of claim 17, wherein the trigger condition further comprises a logical trigger condition.

19. The system of claim 17, wherein the database management unit is further configured to define the trigger condition based on an identity of the data collection source for the incoming FDC data.

20. The system of claim 14, wherein the first subscriber is configured to analyze the incoming FDC data to generate FDC results and send the FDC results to the database management unit.

21. The system of claim 20, wherein the database management unit is further configured to provide a second subscriber list designating a second subscriber for at least a portion of the FDC results and send the portion of the FDC results designated in the second subscriber list to the second subscriber.

22. The system of claim 20, wherein the database management unit is further configured to store the FDC results in parallel with sending the portion of the FDC results designated in the second subscriber list to the second subscriber.

23. The system of claim 20, wherein the database management unit is further configured to send a notification message to the second subscriber that the portion of the FDC results designated in the second subscriber list is stored in the real-time database.

24. The system of claim 21, wherein the database management unit is further configured to define a trigger condition for the second subscriber in the second subscriber list and send the portion of the FDC results designated in the second subscriber list to the second subscriber responsive to the incoming FDC data satisfying the trigger condition.

25. The system of claim 24, wherein the trigger condition further comprises a logical trigger condition.

26. The system of claim 21, wherein the second subscriber is configured to implement an automatic corrective action based on the FDC results.

27. A system, comprising:
means for receiving incoming fault detection and correction (FDC) data;
means for storing the incoming FDC data in a real-time database;
means for providing a first subscriber list designating a first subscriber for al least a portion of the incoming FDC data; and
means for sending the portion of the incoming FDC data designated in the first subscriber list to the first subscriber.

* * * * *